(12) United States Patent
Lee et al.

(10) Patent No.: US 7,163,867 B2
(45) Date of Patent: Jan. 16, 2007

(54) METHOD FOR SLOWING DOWN DOPANT-ENHANCED DIFFUSION IN SUBSTRATES AND DEVICES FABRICATED THEREFROM

(75) Inventors: Kam-Leung Lee, Putnam Valley, NY (US); Huilong Zhu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/627,753

(22) Filed: Jul. 28, 2003

(65) Prior Publication Data

US 2005/0026403 A1 Feb. 3, 2005

(51) Int. Cl.
  *H01L 21/336* (2006.01)
(52) U.S. Cl. .............................. 438/305; 257/E29.193
(58) Field of Classification Search ............... 438/142, 438/162, 197, 231, 232, 286, 300–308, 514–530, 438/532, 542, 581–583, 217, 299; 257/65, 257/616, 617, E21.182, E21.199, E21.335, 257/E21.342, E21.343, E29.193, E21.207
See application file for complete search history.

(56) References Cited

U.S. PATENT DOCUMENTS

| 5,561,072 | A | * | 10/1996 | Saito ........................... 438/513 |
| 6,069,062 | A | | 5/2000 | Downey |
| 6,087,209 | A | | 7/2000 | Yeap et al. |
| 6,180,476 | B1 | | 1/2001 | Yu |
| 6,235,599 | B1 | * | 5/2001 | Yu ............................... 438/305 |
| 6,372,591 | B1 | * | 4/2002 | Mineji et al. ................ 438/305 |
| 6,380,044 | B1 | * | 4/2002 | Talwar et al. ................ 438/308 |
| 6,380,053 | B1 | | 4/2002 | Komatsu |
| 6,410,393 | B1 | | 6/2002 | Hao et al. |
| 6,426,278 | B1 | | 7/2002 | Nowak et al. |
| 6,518,150 | B1 | | 2/2003 | Matsumoto |
| 6,734,527 | B1 | * | 5/2004 | Xiang ......................... 257/616 |
| 6,793,731 | B1 | * | 9/2004 | Hsu et al. ........................ 117/3 |
| 2001/0003364 | A1 | * | 6/2001 | Sugawara et al. ........... 257/192 |
| 2003/0049917 | A1 | * | 3/2003 | Noda .......................... 438/527 |
| 2003/0096490 | A1 | | 5/2003 | Borland et al. |
| 2004/0126998 | A1 | * | 7/2004 | Feudel et al. ................ 438/514 |
| 2004/0159834 | A1 | * | 8/2004 | Huang et al. .................. 257/18 |

FOREIGN PATENT DOCUMENTS

WO WO 97/42652 11/1997

OTHER PUBLICATIONS

Article by T.H. Huang, et al.: "Influence of Fluorine Preamorphization on the Diffusion and Activation of Low-Energy Implanted Boron During Rapid Thermal Annealing", Applied Physics Letters, American Institute of Physics, NY, US vol. 65, No. 14, Oct. 3, 1994, pp. 1829-1831.

(Continued)

*Primary Examiner*—Brook Kebede
(74) *Attorney, Agent, or Firm*—Ido Tuchman, Esq.; McGinn IP Law Group, PLLC

(57) ABSTRACT

A method (and resulting structure) of forming a semiconductor device, includes implanting, on a substrate, a dopant and at least one species, annealing the substrate, the at least one species retarding a diffusion of the dopant during the annealing of the substrate.

41 Claims, 12 Drawing Sheets

OTHER PUBLICATIONS

Article by S. Saito, et al.: "Defect Reduction by MeV ion Implantation for Shallow Junction Formation", Applied Physics Letters, American Institute of Physics, vol. 63, No. 2, Jul. 12, 1993, pp. 197-199.

PCT International Search Report dated Oct. 8, 2004.

PCT Written Opinon of the International Searching Authority, EPO—Jan. 2004.

Article by S. Saito, et al.: Defect Reduction by MeV i on Implantation for Shallow Junction Formation, Applied Physics Letters, American Institute by Physics, vol. 63, No. 2, Jul. 12, 1993, pp. 197-199.

PCT International Search Report dated Oct. 8, 2004.

PCT Written Opinion of the International Searching Authority, date not available or known.

* cited by examiner

METHOD FOR SLOWING DOWN DOPANT-ENHANCED DIFFUSION IN SUBSTRATES AND DEVICES FABRICATED THEREFROM

BACKGROUND OF THE INVENTION

1. Field of the Invention

The present invention generally relates to a semiconductor device, and more particularly to a method and structure for slowing down dopant diffusion in strained Si/Ge substrates for junction formation for devices (e.g., N-MOS devices) in strained Si/SiGe substrates.

2. Description of the Related Art

Strained Si complementary metal oxide semiconductor (CMOS) devices with a strained Si channel on a relaxed $Si_{1-x}Ge_x$ buffer layer offer better device performance over conventional Si CMOS because of the enhancement in both channel electron and hole mobilities, and have been demonstrated for devices as small as about 60 nm (e.g., see FIG. 1 showing a structure 100 including a gate 110, an oxide spacers 120 formed on each side of the gate 110, and an extension junction region 130 formed in the vicinity of the oxide spacer 110).

However, for devices with $L_{eff}$ at about 60 nm or below, an extension junction depth Xj ~30 nm or below would be needed. The diffusion of a dopant in SiGe can form parasitic barriers at the heterojunction in a heterojunction bipolar transistor (HBT).

More importantly, the junction slope Xjs near the channel region should be abrupt (<6 nm/decade), and the dopant concentration at the extension 130 should be ~1E20/cm³.

However, the present inventors have recognized that these shallow junction requirements are difficult to achieve for a dopant (e.g., arsenic) junction in N-type metal oxide semiconductor (NMOS) devices in strained $Si/Si_{1-x}Ge_x$ substrates due to significant arsenic-enhanced diffusion.

That is, experimentally, it has been found that arsenic dopant diffusivity increases exponentially with the percentage of the Ge content in the $Si_{1-x}Ge_x$ buffer layer.

Thus, the present inventors have recognized that this enhanced arsenic dopant diffusion in strained $Si/Si_{1-x}Ge_x$ substrates becomes a significant roadblock for generating ultra-shallow junctions for a small (e.g., about sub-50 nm) NMOS device in strained Si substrates where high % Ge (e.g., >about 20%) is used for higher electron and hole mobility for improved device performance.

In addition, for a sub-50 nm device, the enhanced lateral arsenic dopant diffusion will short-circuit (e.g., see FIG. 1) the source and drain regions of the NMOS device, and will render the device totally inoperable.

That is, as shown in FIG. 1, arsenic dopant concentration at about 1E19/cm³ and about 1E19 cm³ are immediately below the center of the gate 110 (e.g., a polysilicon gate). This high concentration of dopant underneath the gate indicates shorting due to enhanced arsenic junction diffusion from the extension junction region 130 to the gate region 110.

Thus, the present inventors have recognized that, prior to the present invention, there have been no known techniques (or resulting structures) for slowing down the arsenic enhanced diffusion in strained $Si/Si_{1-x}Ge_x$ or $Si_{1-x}Ge_x/Si$ device substrates.

SUMMARY OF THE INVENTION

In view of the foregoing and other problems, drawbacks, and disadvantages of the conventional methods and structures, an exemplary feature of the present invention is to provide a method and structure for slowing down the dopant (e.g., arsenic, P, and/or Sb) enhanced diffusion in strained $Si/Si_{1-x}Ge_x$ device substrates.

An exemplary aspect of the present invention includes a method of forming a semiconductor device. The method includes implanting, on a substrate, a dopant and at least one species, and annealing the substrate, the at least one species retarding a diffusion of the dopant during the annealing of the substrate.

Specifically, the dosage of the at least one species may exceed a preamorphization threshold of the substrate. In particular, a dosage of the at least one species is at least about 3 times the preamorphization threshold of the substrate, and in some cases, the dosage of the at least one species is at least about 5 times the preamorphization threshold of the substrate, or at least about 7 times the preamorphization threshold of the substrate.

Further, the at least one species may damage a junction (e.g., an extension junction) formed by the dopant. For example, the junction may have a thickness of no more than about 30 nm. Further, the junction may have a slope which is at least about 5 nm per decade of change in concentration of the dopant.

Further, the substrate may include one of silicon, $SiGe_x$ and strained Si. In addition, the at least one species may include at least one of Xe, Ge, Si, Ar, Kr, Ne, He and N, and the dopant may include at least one of As, P, and Sb. In addition, the dopant may be implanted at a time which is one of prior to the implanting the species, and after the implanting of the species.

The method may also include forming a source and drain region in the substrate, and forming a metal silicide contact over the source and drain region. For example, the source and drain region may be formed at a time which is prior to the implanting of the dopant, or after the implanting of the dopant. In any case, the dopant may be implanted at a time which is one of prior to the implanting the species, and after the implanting the species.

Further, the species may be implanted at least about 10 to about 20 nm deeper than the dopant. In addition, the species may have an implantation energy for surrounding at least a portion of an extension region in the substrate. In addition, the species may have a first implantation energy for sufficient to create a region surrounding at least a portion of an extension region in the substrate, and a second implantation energy (e.g., greater than the first implantation energy) sufficient to create a region for surrounding at least a portion of a source/drain region in the substrate. The species may alternatively have an implantation energy sufficient for creating a region for surrounding at least a portion of an extension region and at least a portion of a source/drain region in the substrate.

Another aspect of the present invention includes a method of reducing a thermal diffusion of a dopant. The method includes implanting a dopant on a substrate, implanting, as a second species with the dopant, at least one species on the substrate, and annealing the substrate, the at least one species retarding a diffusion of the dopant during the annealing of the substrate.

For example, the annealing the substrate may be performed after the implanting the dopant and the implanting the species. Further, the implanting the dopant may be performed after the implanting the at least one species. In that case, the method may further include annealing the substrate after the implanting the species and before the implanting the dopant.

Another aspect of the present invention includes a method of forming a junction in a semiconductor substrate. The method includes implanting a dopant on a substrate, implanting, as a second species with the dopant, at least one species on the substrate, and annealing the substrate, the at least one species retarding a diffusion of the dopant during the annealing of the substrate.

Another aspect of the present invention includes a semiconductor device, which includes a semiconductor substrate, a dopant formed in the substrate, to define a junction, and a species formed in the substrate as a second species with the dopant, and in a concentration which is sufficient to retard a diffusion of the dopant. The device may further include a gate formed over the channel, a source and drain region formed adjacent the first and second materials, and a contact formed over the source and drain regions.

For example, the junction may have a thickness of no more than about 30 nm, and a slope which is at least about 5 nm per decade of change in concentration of dopant. Further, the substrate may include one of silicon, SiGe, and strained Si. For example, the SiGe may include one of relaxed SiGe and strained SiGe. Further, the strained SiGe may include SiGe under one of a compressive strain and a tensile strain.

Hence, with the unique and unobvious combination of exemplary features of the invention, the present invention provides a method and structure for slowing down the arsenic enhanced diffusion in strained $Si/S_{1-x}Ge_x$ device substrates. The invention can also be extended to silicon substrates and strained $Si_{1-x}Ge_x/Si$.

BRIEF DESCRIPTION OF THE DRAWINGS

The foregoing and other exemplary purposes, aspects and advantages will be better understood from the following detailed description of exemplary embodiments of the invention with reference to the drawings, in which.

DETAILED DESCRIPTION OF EXEMPLARY EMBODIMENTS OF THE INVENTION

Figure 1:
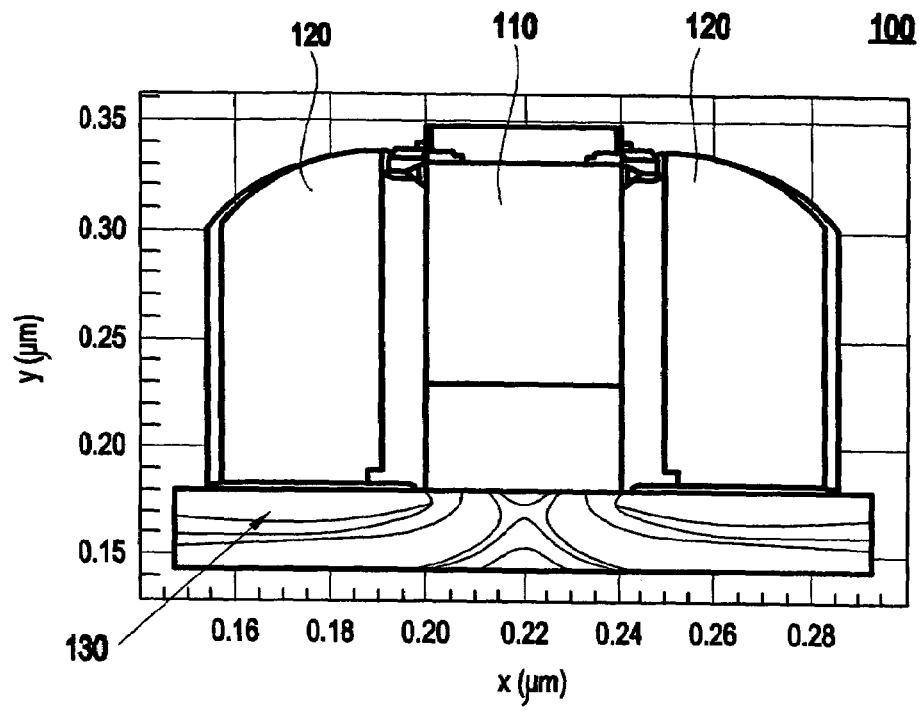
FIG. 1 shows a graph (and structure 100) which illustrates that as arsenic dopant concentration increases, shorting due to enhanced arsenic junction diffusion from an extension junction region 130 to a gate region 110 may occur.

Referring now to the drawings, and more particularly to FIGS. 2–7G, there are shown exemplary embodiments of the method and structures according to the present invention.

Exemplary Embodiment

Generally, the exemplary techniques according to the present invention advantageously use the implanting of at least one atom/ion species (e.g., one or a plurality of atom/ion species) on a substrate. For example, the atom/ion species may include an inert species (e.g., Xe, Ge, Si, Ar, Kr, Ne, He, and N) and may be implanted in a vicinity of a device dopant (e.g., arsenic will be assumed throughout the present application, but as mentioned above the dopant may be P, and/or Sb). Specifically, the atom/ion species may be implanted in the vicinity of an extension region (e.g., an extension junction region) and/or a source/drain region (e.g., a source/drain junction region) of the substrate (e.g., a strained $Si/Si_{1-x}Ge_x$ substrate).

Specifically, the present inventors have discovered that the excess interstitials and vacancy sinks created by the atom/ion species in the vicinity of the arsenic dopants help to slow down both vertical and lateral arsenic enhanced diffusion in the extension junction region or both the arsenic extension or source/drain junction regions.

Thus, the method of the present invention enables sub-30 nM (e.g., junction depths in a range of about 20 nm to about 30 nm have been shown by the present invention), ultra-shallow arsenic junction to be formed in the strained Si/$Si_{1-x}Ge_x$ substrate, and prevents undesirable lateral arsenic diffusion into the device channel region.

In this manner, the present invention enables high performance sub-50 nm NMOS devices to be fabricated in strained $Si/S_{1-x}Ge_x$ substrates. It is noted that the strained substrates could be under tensile or compressive strain. By the same token, the SiGe could be relaxed. There is no requirement that it be strained.

Figure 2:
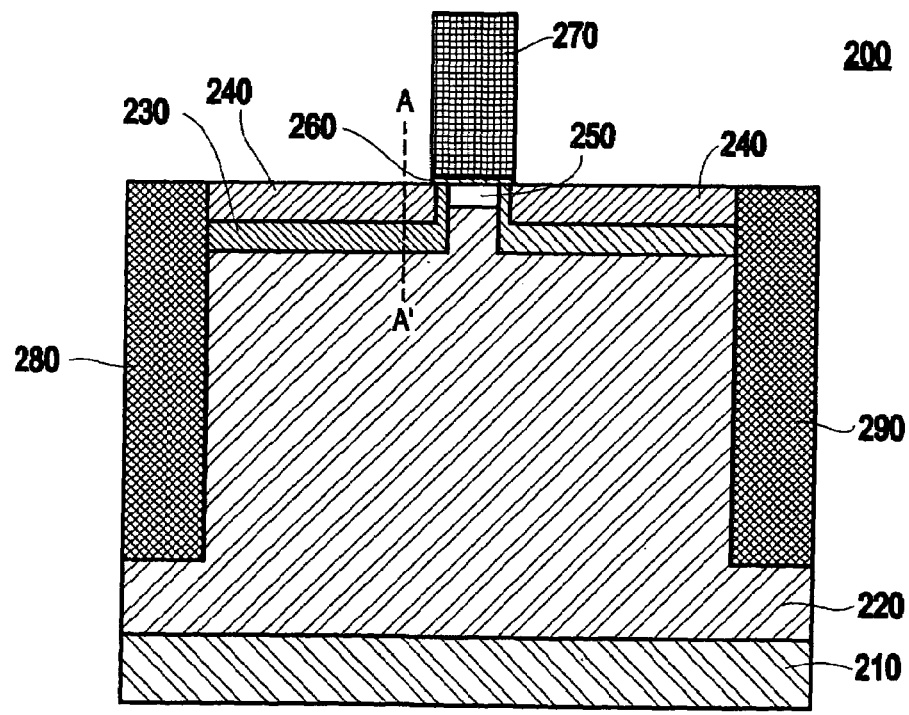
FIG. 2 illustrates a structure 200 formed according to an exemplary embodiment of the present invention.

Turning now to FIG. 2, FIG. 2 illustrates a structure 200 formed by the present invention. As shown, the structure (e.g., an exemplary NMOS device) 200 includes a substrate 210 (e.g., preferably formed of silicon or the like), a relaxed $Si_{1-x}/Ge_x$ layer 220 formed over (e.g., on top of ) the Si substrate 210. The Si/Ge layer 220 is a graded layer which has a crystal lattice which is more and more relaxed in a direction extending away from a top surface of the substrate 210 with the concentration of Ge increasing in a direction away from the top surface of the substrate 210.

A relatively inert atom/ion species (e.g., Xe, Ge, Si, Ar, Kr, Ne, He, and N) 230 implant is formed below an arsenic extension 240, and is formed to surround first and second surfaces of the arsenic extension 240 (e.g., unreferenced; in FIG. 2, a bottom surface and a side surface of the arsenic extension 240).

Additionally, preferably, the atom/ion species selected is from other than the dopant being employed (e.g., in the present exemplarily application, the atom/ion species is preferably selected to be other than the As dopant).

A strained silicon channel 250 is formed between opposing side surfaces of adjacent arsenic extensions 240, which have the atom/ion species thereon.

A gate 270 (e.g., formed of polysilicon, metal or the like) is formed above the strained silicon channel 250. A gate oxide 260 is formed between the gate 270 and the channel 250. A shallow trench isolation (STI) 290, formed of dielectric or the like, is formed between devices, adjacent the source and drain.

Thus, as illustrated exemplary in FIG. 2, after the implant of arsenic dopants in the extension regions 240, the atom/ion species (e.g., Xe, Si, etc.) implant species are implanted around (e.g., around at least a portion of) the arsenic extension junction region of the NMOS device in strained $Si/Si_{1-x}Ge_x$ substrates.

The implant range of the Xe or Si is such that it is about 10 to about 20 nm deeper than that of the arsenic dopant as implant depth, such that the Xe or Si atom/ion implant species create excess interstitials and vacancy sinks, thereby to reduce the vacancy population in the immediate vicinity of the arsenic dopants during annealing of junctions of the arsenic extensions 240.

In this manner, the arsenic dopant diffusion is greatly reduced, and enables much shallower arsenic junctions to be formed in NMOS devices in strained $Si/Si_{1-x}Ge_x$ substrates.

Thus, the mechanism of enhanced Arsenic diffusion in strained $Si/Si_{1-x}Ge_x$ with % Ge>20% is largely due to high vacancy population in the $Si_{1-x}Ge_x$ layer and the corresponding increase in the vacancy component of arsenic diffusion.

As mentioned above, an exemplary aspect of the present invention is using implanting of atom/ion species (e.g., Xe, Ge, Si, Ar, Kr, Ne, He, and N) in the device extension junction region or arsenic device extension and source drain junction regions in the strained $Si/S_{1-x}Ge_x$ substrate.

It is noted that the present invention is not limited to the above species, but any species may be used so long as the species retards a diffusion of the dopant (e.g., arsenic in the exemplary embodiment, but the dopant may also include, for example, P, and/or Sb) in the substrate. Further, it is preferable generally that the atomic/ionic species be larger rather than smaller.

During rapid thermal anneal (RTA), the excess interstitials and vacancy sinks created by the atom/ion species help to reduce the vacancy population, and hence retard the arsenic diffusion in the strained $Si/Si_{1-x}Ge_x$ substrates.

Figure 3A:
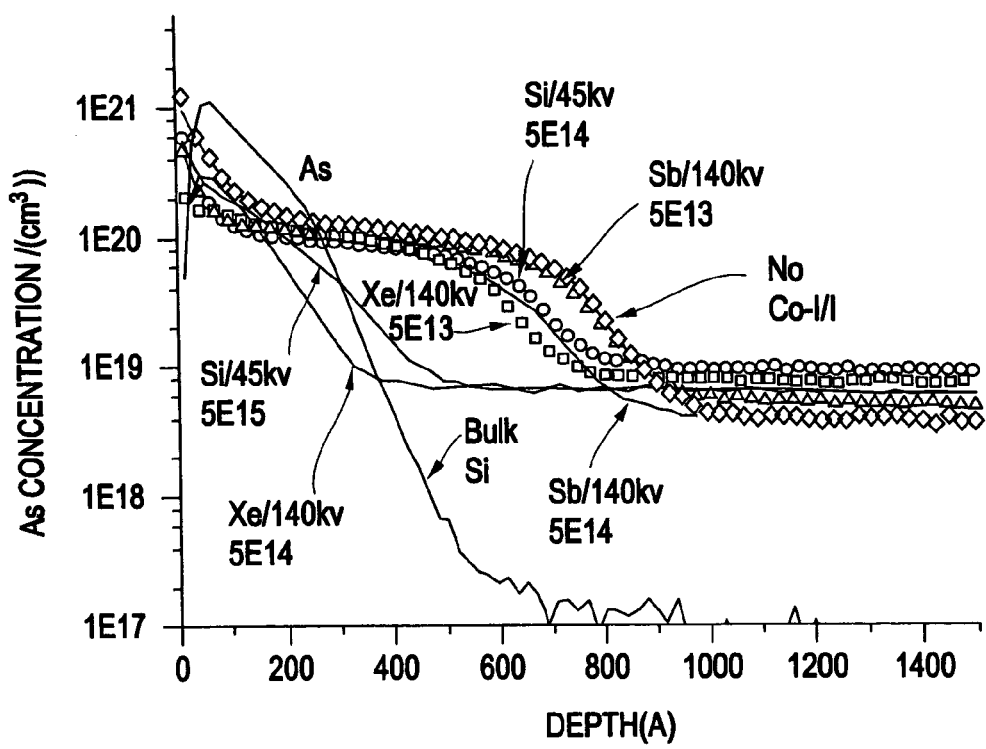
FIG. 3A illustrates a comparison of arsenic junction profiles with (and without) an atom/ion species (e.g., Xe, Si, etc.) according to an exemplary technique of the present invention.

An example of slowing down arsenic junction diffusion in strained $Si/Si_{1-x}Ge_x$ substrates along section A–A' in FIG. 2 is demonstrated in the comparison of arsenic dopant junction profiles shown in FIG. 3A for the cases of with, or without, Xe or Si as a second species implanted with the arsenic extension junction.

That is, FIG. 3A illustrates experimental data (SIMS profiles) which shows the slow down of As dopants diffusion in strained $Si/Si_{1-x}Ge_x$ with Xe or Si species implants. In these experiments, a 50-nm, low temperature oxide (LTO) was formed on strained $Si/Si_{1-x}Ge_x$ with a 5 nm silicon cap, with X=30%.

That is, in these examples, the strained Si cap thickness was ~5 nm, the Ge content in the $Si_{1-x}Ge_x$ relaxed buffered layer is ~30%, the arsenic junction implant was about 1 kV with about $1E15/cm^2$ dose, the Xe or Si second species was such that their implant range was ~10 nm deeper than the 1 kV arsenic as implant range. The implant dosage for the Xe or Si second species was about $5E14/cm^2$ or about $5E15/cm^2$, respectively.

These dosages are advantageously above (e.g., preferably far above) the preamorphization threshold dosage for the atom/ion species (e.g., Xe and Si species), such that a sufficient amount of excess interstitials and vacancies sinks are generated to slow down arsenic dopant motions.

That is, for purposes of the present application, "preamorphization threshold" means the dosage at which a crystal lattice converts into a substantially completely random (e.g., "damaged") pattern, thereby to become an amorphous structure.

Thus, whichever atom/species is used, the dosage should be above (e.g., preferably far above) the preamorphization threshold to enable such a conversion. As would be known by one of ordinary skill in the art taking the present application as a whole, the preamorphization threshold will vary depending upon which species/atom is employed. A larger atom will create more damage (e.g., excess interstitials and vacancy sinks, etc.), and thus a smaller total dosage can be employed.

Conversely, a smaller atom will create relatively less damage, and thus will use a larger dosage, to achieve the preamorphization threshold. Hence, whatever atom is employed, a dosage is selected which is above (e.g., preferably at least about 3 times above, and in many cases more preferably, at least about 5 times above, and most preferably at least about 7 times above) the dosage to meet the preamorphization threshold.

Thus, for example, for Xenon, the preamorphization threshold dosage is approximately $1E14/cm^2$. Thus, the dosage for Xenon could be at least about $3E14/cm^2$ (e.g., about $3E14/cm^2$ to about $5E14/cm^2$). Further, for silicon, the preamorphization threshold dosage is approximately $1E15/cm^2$. Thus, the dosage for silicon could be at least about $3E15/cm^2$ (e.g., about $3E15/cm^2$ to about $5EB5/cm^2$).

Again, it is noted that the invention can be generalized to using an implant species using an exemplary dosage to cause damage resulting in interstitials and vacancy sinks which would slow down the dopant mobility.

Additionally, the implant species preferably is formed relatively near the vicinity of the junction implant (e.g., arsenic in the exemplary case). Thus, for example, the implant species (e.g., Xe, Si, etc.) can be within about 100 Å to about 200 Å from the As junction implant profile.

That is, suppose the As junction profile is upwards of about 100 Å, then the peak of the species (e.g., Xe) can be implanted at about the 100 Å region or about the 300 Å region (e.g., right behind it).

Then, the arsenic junction and the Xe (or Si or other species) co-implants are annealed rapidly together in a range preferably within about 800 to about 1100° C. for about 1 second to about 5 seconds, for implant damage removal and dopant activation.

For such an anneal, a rapid thermal anneal (RTA) (or "spike annealing") may be employed in a which a high temperature (e.g., about 1100° C.) is immediately obtained in a very short time period (e.g., the short period of time being defined and limited in practice to what the specific RTA tool can achieve). For such an RTA or "spike annealing", a flash lamp (e.g., halogen lamp, laser light, etc.) could be employed. In the examples of FIG. 3A, RTA conditions were 1000° C./1 s in 100% argon.

As shown in FIG. 3A, with an ultra-high chemical vapor deposition (UHCVD) strained $Si/Si_{1-x}Ge_x$ (x=20%) in a comparison with the As junction with no second species implanted (e.g., Xe, Si, etc.), there was a significant reduction in arsenic junction diffusion with a Xe or Si species implant, whereas without a Xe or Si species implant, the arsenic junction depth at $1E18/cm^3$ dopant concentration was ~85 nm. With a Xe species, As junction depth was ~30 nm. With a Si species implant, the As junction was ~50 nm.

Thus, this example demonstrates the Xe species implants can reduce the Arsenic junction depth (e.g., by almost a factor of 3). The arsenic shallow junction depth of about 30 nm achieved with species (e.g., Xe, Si, etc.) co-implants enables high performance sub-50 nm NMOS device to be fabricated in the strained Si/Si$_{1-x}$Ge$_x$ substrates.

Figure 3B:
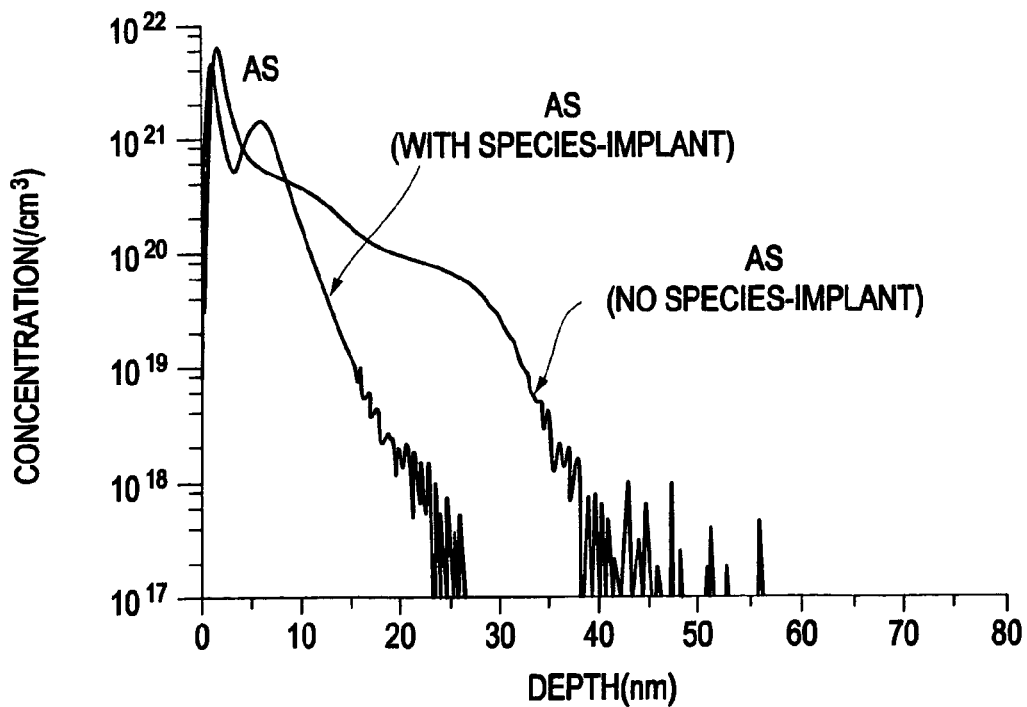
FIG. 3B illustrates a profile of a junction formed according to an exemplary aspect of the present invention.

For example, FIG. 3B illustrates the arsenic junction profiles for two junctions formed with and without a Xe species implant employed in a structure including the ultra-high chemical vapor deposition (UHCVD) strained Si/Si$_{1-x}$Ge$_x$ (x=20%). A Si cap about 20 nm was also employed, and the RTA conditions were 1000° C./5 s in 100% argon.

It is understood that the quality of a junction may be defined by the shallowness of the junction and the abruptness (e.g., the sharpness of the slope) of the junction. FIG. 3B illustrates such an improved quality junction, and specifically a junction with Xe species implant having a depth of about 20 nm and a slope of about 5 nm per decade of change in concentration of dopant (e.g., in a vicinity of the junction), which is much improved over conventional junctions.

Hereinbelow and referring to FIGS. 4A–7G, various exemplary process flows are described for the generation of high performance sub-50 nm NMOS device in strained Si/Si$_{1-x}$Ge$_x$ substrates incorporating the exemplary method of the present invention.

First Exemplary Technique

FIGS. 4A–4D illustrate processing steps of a first exemplary technique of forming a CMOS (e.g., NMOS) device according to the present invention. FIG. 4E illustrates a flowchart 400 of the exemplary technique of FIGS. 4A–4D.

Figure 4A:
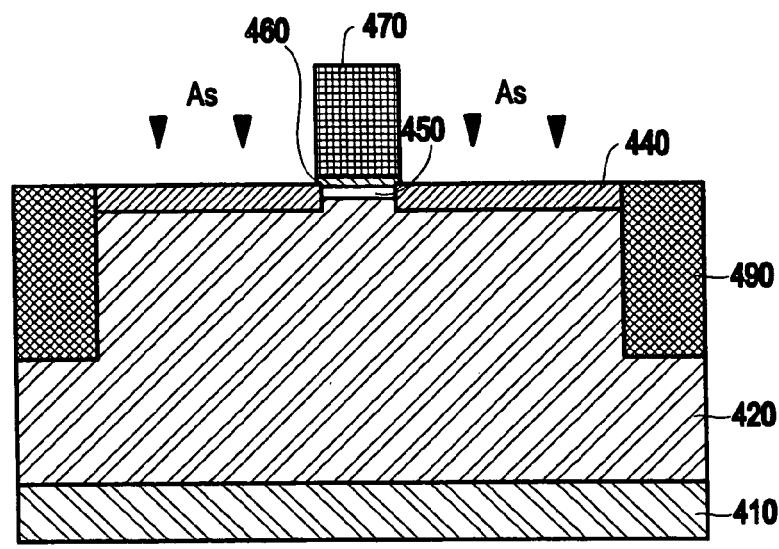
FIGS. 4A–4D illustrate processing steps of a first exemplary technique of forming a CMOS (e.g., NMOS) device according to the present invention.
Figure 4B:
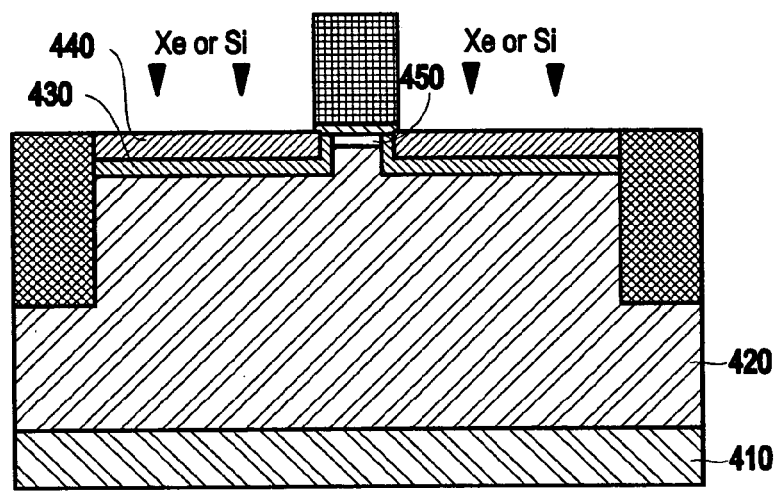
Figure 4C:
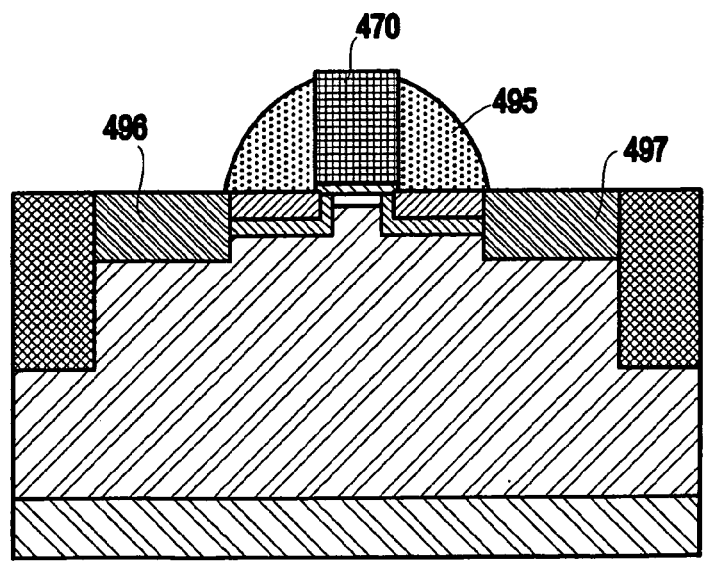
Figure 4D:
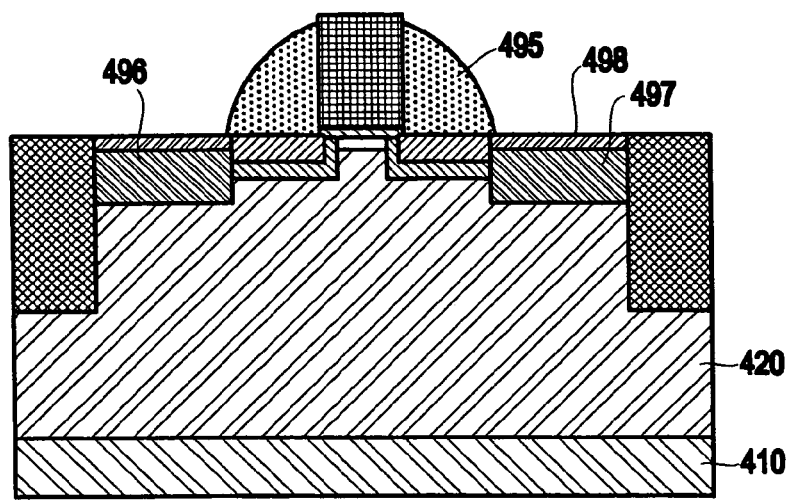
Figure 4E:
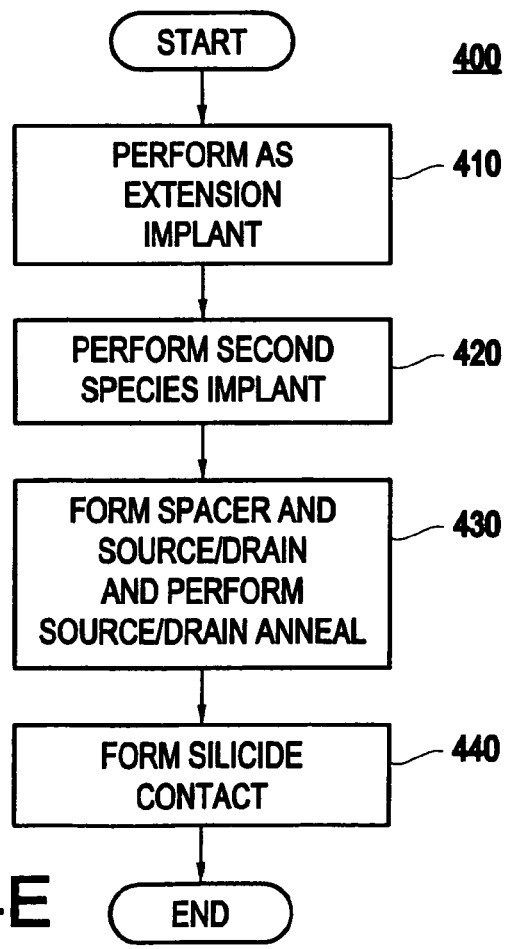
FIG. 4E illustrates a flowchart 400 of the exemplary technique of FIGS. 4A–4D.

First, in FIG. 4A and as shown in FIG. 4E, in step 410, an arsenic extension implant 440 is formed. As shown, the implant 440 is formed in a structure 400 somewhat similar to structure 200 shown in FIG. 2.

That is, structure 400 includes a substrate 410 (e.g., preferably formed of silicon, silicon-on-insulator (SOI), or the like), and a relaxed Si$_{1-x}$/Ge$_x$ layer 420 formed over (e.g., on top of) the substrate 410. The Si/Ge layer 420 is a graded layer which has a crystal lattice which is more and more relaxed in a direction away from a top surface of the substrate 410, as a result of the Ge concentration in the Si/Ge layer increasing in a direction going away from the top surface of the substrate 410.

A strained silicon channel 450 is formed between opposing side surfaces of adjacent arsenic extensions 440.

A gate 470 (e.g., formed of polysilicon, metal or the like) is formed above the stained silicon channel 450. A gate oxide 460 is formed between the gate 470 and the channel 450. A shallow trench isolation (STI) 490, formed of dielectric or the like, is formed between devices, adjacent the source and drain.

As illustrated in FIG. 4B, after the implant of arsenic dopants in the extension regions 440, the atom/ion species (e.g., Xe, Si, etc.) are implanted around (e.g., around at least a portion of) the arsenic extension junction 440 region of the NMOS device in strained Si/Si$_{1-x}$Ge$_x$ substrates. (In this exemplary application, Xe or Si will be assumed to have been used.) In FIG. 4B (and as shown in FIG. 4E, in step 420), the atom/ion species (Xe, Ge, Si, Ar, Kr, Ne, He, and N) implant 430 is formed, as described above. As shown, the atom/ion implant 430 will be formed under the Arsenic extension 440, and will have a "lip" formed vertically between the strained silicon channel 450 and the arsenic extension 440. As such, the atom/ion species implant may have an L-shape (in cross section). Thus, at least two sides of the arsenic extension 440 will be surrounded by the atom/ion species implant.

Again, the atom/ion species implanted on the substrate creates vacancy sinks in the vicinity of the arsenic dopant. The presence of the vacancy sinks created by the atom/ion species removes vacancies in the vicinity of the arsenic dopant, thereby retarding (e.g., slowing down) the arsenic diffusion.

Another possible explanation for the mechanism of the present invention is that the atom/ion species may have a binding force to vacancies which is greater than the binding force to vacancies of the dopant. It has also been theorized that the atom/ion species may have a binding force to the dopant which is stronger than the binding force to the dopant of Ge and/or Si atoms. However, these theories should not be considered as limiting the present invention in any manner.

Then, in FIG. 4C (and as shown in FIG. 4E, in step 430), a spacer 495 is formed, as well as a source/drain implantation is performed, thereby to form the source 496 and drain 497. Thereafter, a source/drain anneal is performed.

It is noted that, in the conventional techniques and devices, typically an anneal is performed after the arsenic implantation step (e.g., after step 410). Thus, in the conventional methods, an extension junction anneal would be performed after the arsenic implantation.

In contrast, the invention does not need to perform an anneal after the arsenic implantation. Instead, the invention may delay the anneal until after the spacer 495 and the source 496/drain 497 implant are in place.

In FIG. 4D (and as shown in FIG. 4E, in step 440), silicide contacts 498 are formed over the source 496 and drain 497, thereby to complete the device.

Thus, ultra-shallow junctions (e.g., sub-30 nm junctions) can be formed with this exemplary technique of the present invention. It is noted that, while steps may not be necessarily saved by the present invention in view of the conventional techniques, there are no additional steps needed to obtain such ultra-shallow junctions and the invention provides a very convenient method (e.g., not costly) to obtain the ultra-shallow junctions.

It is noted that, in some conventional techniques, some implant patterns may use co-implants in which implants are performed one after another (e.g., in sequence).

However, the invention differs considerably from these techniques in that ultra-shallow junctions (e.g., about 20 nm thickness) having a good slope (e.g., about 5 nm per decade of change in concentration of dopant) can be formed, and also such implants of the invention are being performed in strained silicon (or silicon).

It is noted that the invention is applicable to a large range of Ge composition for the Si$_{1-x}$Ge$_x$ layer (e.g., about x=0.14 to about x=0.75).

Second Exemplary Technique

FIGS. 5A–5D illustrate processing steps of a second exemplary technique of forming a CMOS (e.g., NMOS) device according to the present invention. FIG. 5E illustrates a flowchart 500 of the exemplary technique of FIG. 5A–5D.

The second exemplary technique is similar to the first exemplary technique (e.g., of FIGS. 4A–4D) except that the first and second steps of the first technique are reversed.

Figure 5A:
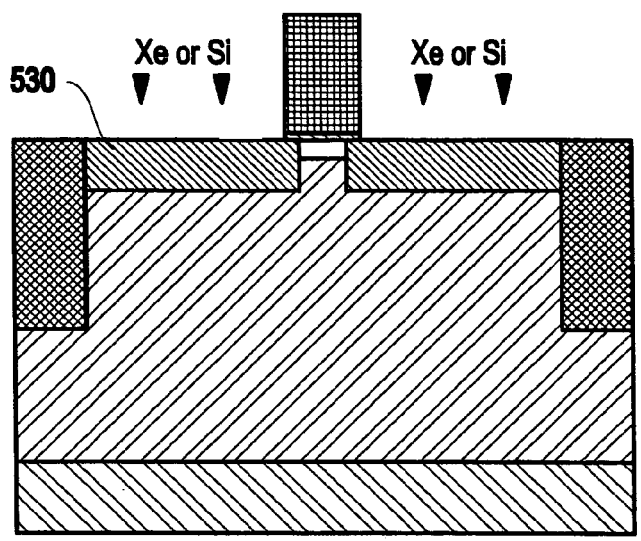
FIG. 5A–5D illustrate processing steps of a second exemplary technique of forming a CMOS (e.g., NMOS) device according to the present invention.
Figure 5B:
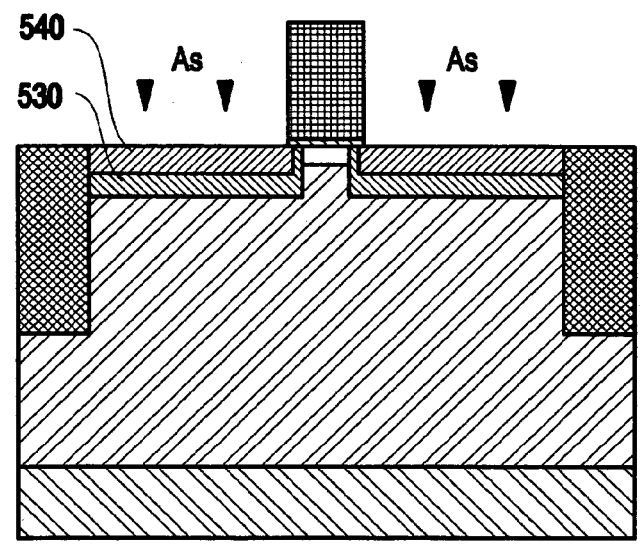

That is, as illustrated exemplary in FIG. 5B, first the atom/ion species (e.g., Xe, Si, etc.) is implanted.

Then in step 520 and as shown in FIG. 5B, an arsenic extension junction 540 region of the NMOS device in strained Si/Si$_{1-x}$Ge$_x$ substrates.

Figure 5C:
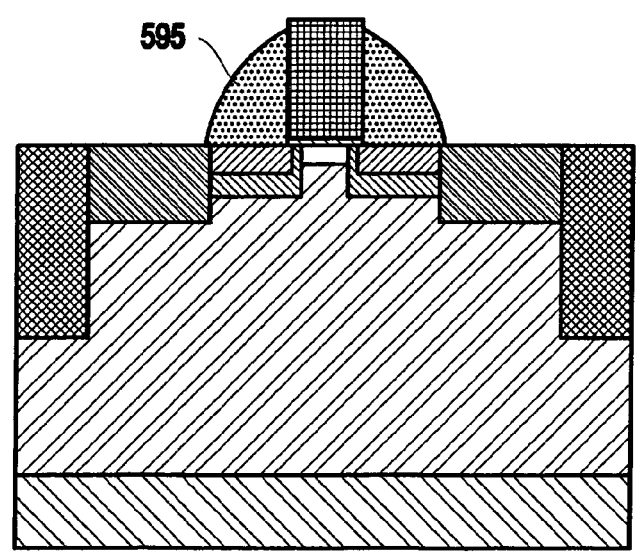
Figure 5D:
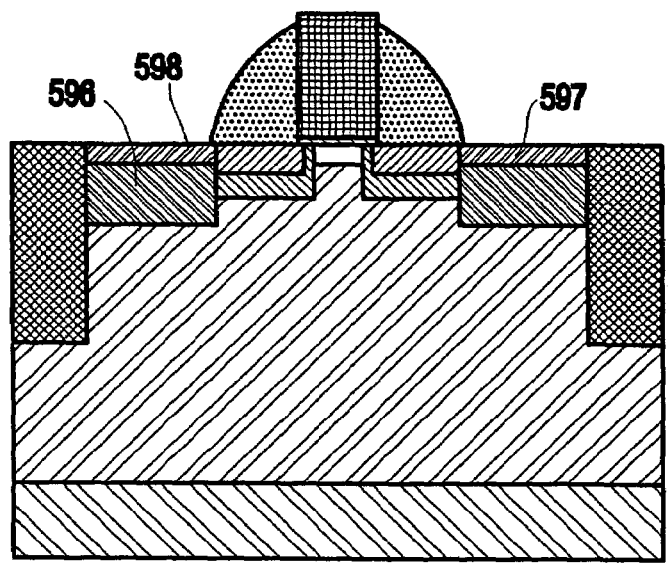
Figure 5E:
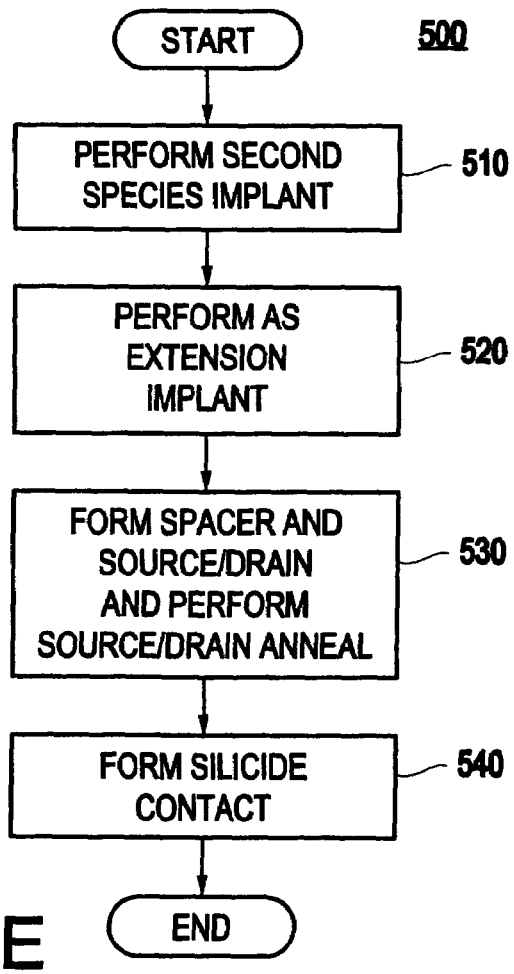
FIG. 5E illustrates a flowchart 500 of the exemplary technique of FIGS. 5A–5D.

Then, similarly to step 430, in FIG. 5C (and as shown in FIG. 5E, in step 530), a spacer 595 is formed, as well as a source/drain implantation is performed, thereby to form the source 596 and drain 597. Thereafter, a source/drain anneal is performed.

Similarly to FIG. 4D and step 440 in FIG. 4, in FIG. 5D (and as shown in FIG. 5E, in step 540), contacts 598 are formed over the source 596 and drain 597, thereby to complete the device.

Thus, again, the second technique is similar to the first technique, except that the order of the arsenic implant and the second species implant is reversed. Thus, the designer would have some flexibility in forming the ultra-shallow junctions.

It is noted that, after step 510 (e.g., performing the atom/ion species implantation) and before step 520 of forming the As extension implant, an anneal could be optionally performed immediately thereafter to remove the damage created by the species implantation. Such an anneal could be a relatively high temperature anneal (e.g., a rapid thermal anneal performed between about 950° C. to about 1100° C. for a suitable time such as up to about 5 seconds) since the junction has not yet been formed. Thereafter, steps 520 and so forth could be performed (including performing a final source/drain anneal).

Third Exemplary Technique

FIGS. 6A–6D illustrate processing steps of a third exemplary technique of forming a CMOS (e.g., NMOS) device according to the present invention. FIG. 6E illustrates a flowchart 600 of the exemplary technique of FIGS. 6A–6D.

The third exemplary technique is somewhat similar to the first and second techniques, except that the species implant is made to have a somewhat greater thickness and surrounds (e.g., encloses) (e.g., surrounds at least a portion of) the source and drain region and the arsenic implant extension.

Figure 6A:
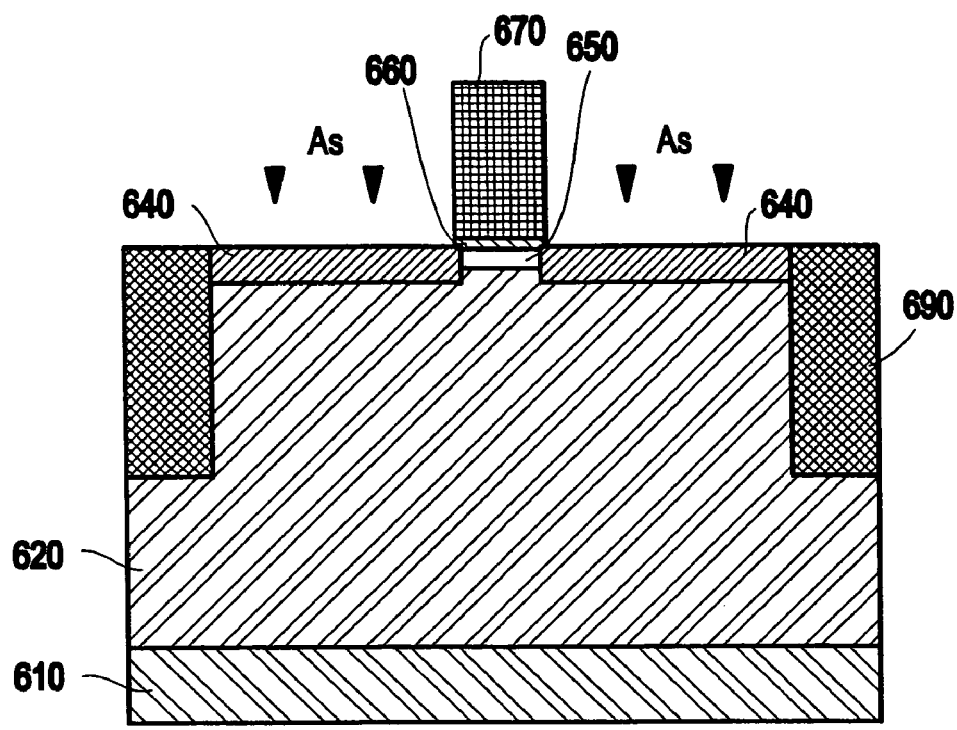
FIGS. 6A–6D illustrate processing steps of a third exemplary technique of forming a CMOS (e.g., NMOS) device according to the present invention.
Figure 6B:
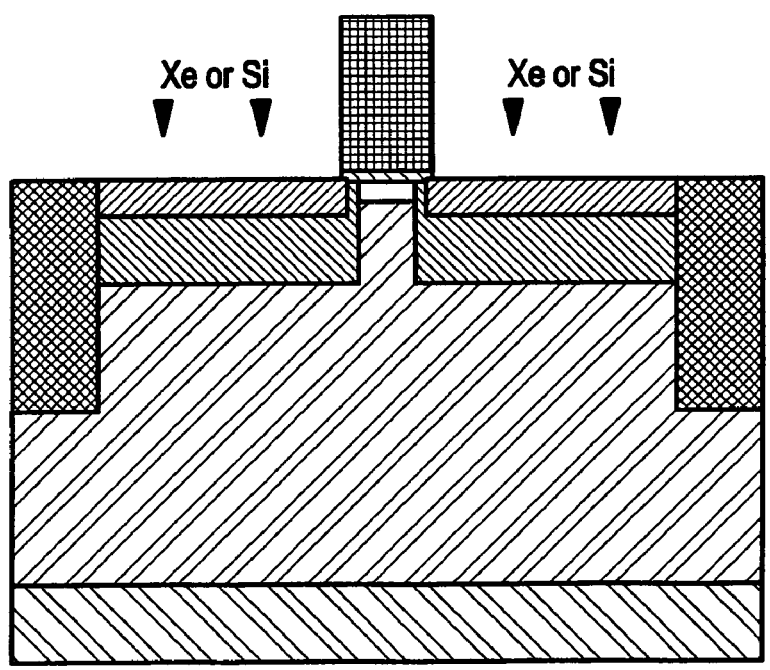
Figure 6C:
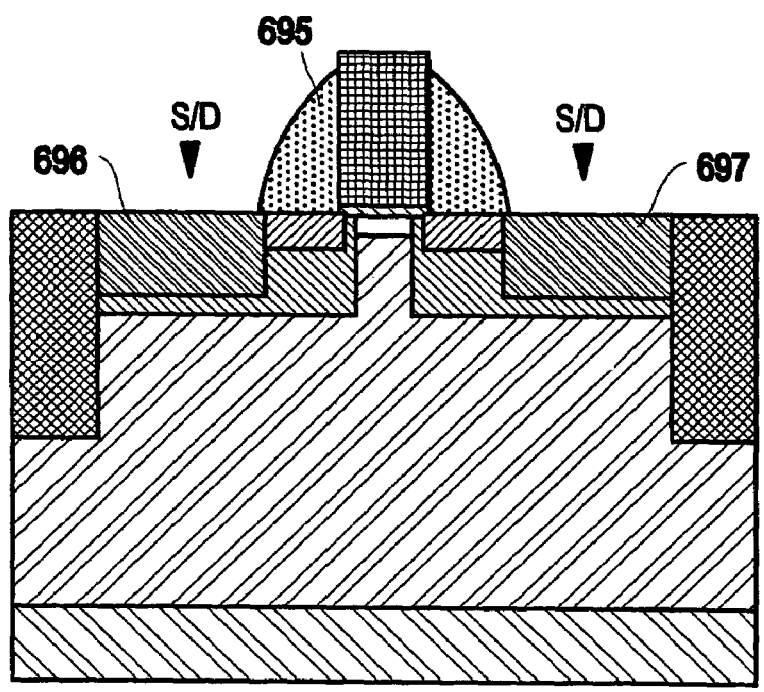
Figure 6D:
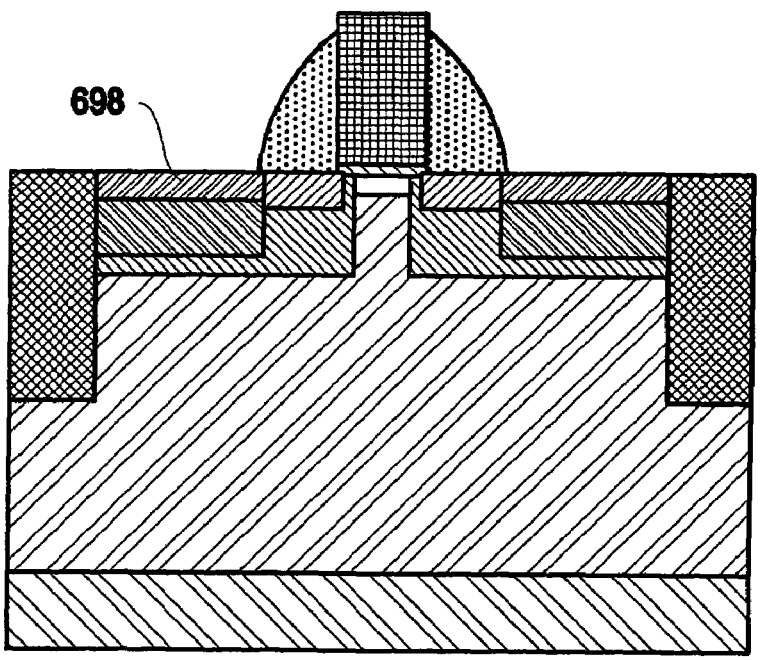
Figure 6E:
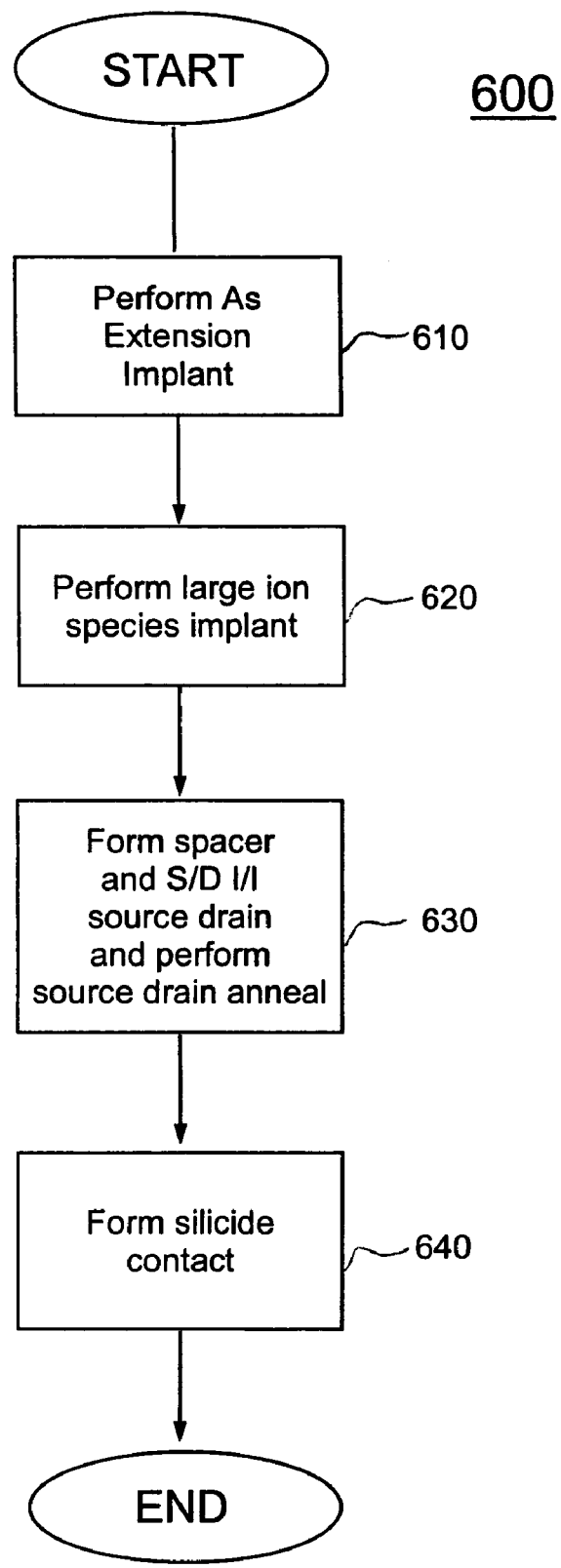
FIG. 6E illustrates a flowchart 600 of the exemplary technique of FIGS. 6A–6D.

First, in FIG. 6A and as shown in FIG. 6E, in step 610, an arsenic extension implant 640 is formed. As shown, the implant 640 is formed in a structure 600 somewhat similar to structure 200 shown in FIG. 2.

That is, structure 600 includes a substrate 610 (e.g., preferably formed of silicon, silicon-on-insulator, or the like), and a relaxed $Si_{1-x}/Ge_x$ layer 620 formed over (e.g., on top of) the Substrate 610. The Si/Ge layer 620 is a graded layer which has a crystal lattice which is more and more relaxed in a direction away from a top surface of the substrate 610.

A strained silicon channel 650 is formed between opposing side surfaces of adjacent arsenic extensions 640.

A gate 670 (e.g., formed of polysilicon, metal or the like) is formed above the stained silicon channel 650. A gate oxide 660 is formed between the gate 670 and the channel 650. A shallow trench isolation (STI) 690, formed of dielectric or the like, is formed between devices, adjacent the source and drain.

As illustrated exemplarily in FIG. 6B (and as shown in FIG. 6E, in step 620), after the implant of arsenic dopants in the extension regions 640, the atom/ion species (e.g., Xe, Si, etc.) is implanted around (e.g., around at least a portion of) the arsenic extension junction 640 region of the NMOS device in strained $Si/Si_{1-x}Ge_x$ substrates.

Then, in FIG. 6C (and as shown in FIG. 6E, in step 630), a spacer 695 is formed, as well as a source/drain implantation is performed, thereby to form the source 696 and drain 697. Thereafter, a source/drain anneal is performed.

It is noted that the atom/ion species implant surrounds/encloses (e.g., surrounds at least a portion of) the extension and the source/drain regions. That is, the extension is an arsenic implant, and the source/drain is an arsenic implant as well. This means that one obtains enhanced arsenic diffusion from both the extension implant and the source/drain region implant. Thus, arsenic ions can diffuse into the channel area or even the source/drain can diffuse very fast so as to initially overshadow the extension.

If the species implant is relatively deep, then one can stop the arsenic diffusion in the source/drain region and the arsenic diffusion in the arsenic extension by surrounding (e.g., surrounding at least a portion of) the same with the species implant, thereby providing more control. Thus, in contrast to the first and second exemplary techniques, the third technique can slow down the arsenic diffusion in both the arsenic extension and the source/drain, thereby providing a better device.

As shown in FIG. 3A, it can be clearly seen that the source/drain is deeper than the species implant, as compared to the structure of FIG. 6A where the source/drain (and arsenic extension) are surrounded (e.g., at least a portion are surrounded) by the species implant.

In FIG. 6D (and as shown in FIG. 6E, in step 640), contacts 698 are formed over the source 696 and drain 697, thereby to complete the device.

Fourth Exemplary Technique

FIGS. 7A–7D illustrate processing steps of a fourth exemplary technique of forming a CMOS (e.g., NMOS) device according to the present invention. FIG. 7E illustrates a flowchart 700 of the exemplary technique of FIGS. 7A–7D.

This exemplary technique is similar to the first technique (e.g., shown in FIGS. 4A–4D), except that a different formation sequence is employed, That is, a disposable spacer is used as an implant mask in forming the source/drain, and the order of forming the source/drain is reversed from that of the previous techniques. Thus, the source/drain is formed first in the fourth exemplary technique, followed by forming the Arsenic extension, the species implant, the spacer formation, and the silicide contacts.

Figure 7A:
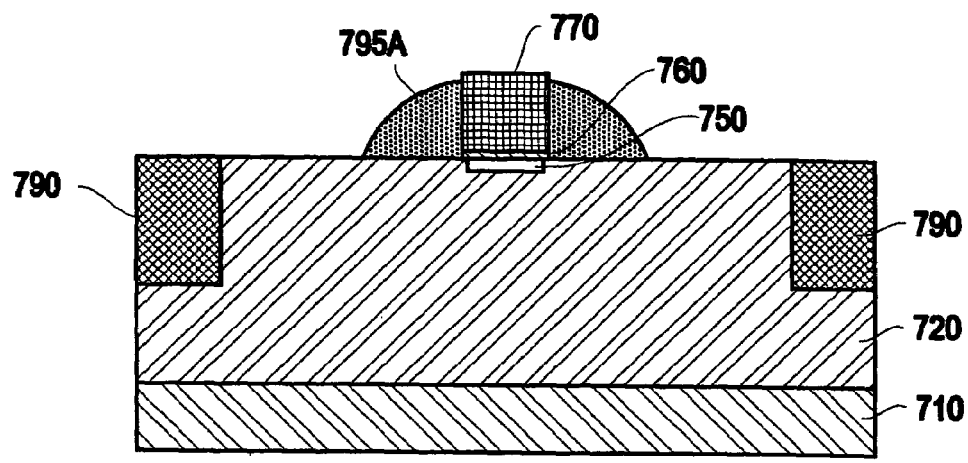
FIGS. 7A–7F illustrate processing steps of a fourth exemplary technique of forming a CMOS (e.g., NMOS) device according to the present invention.
Figure 7B:
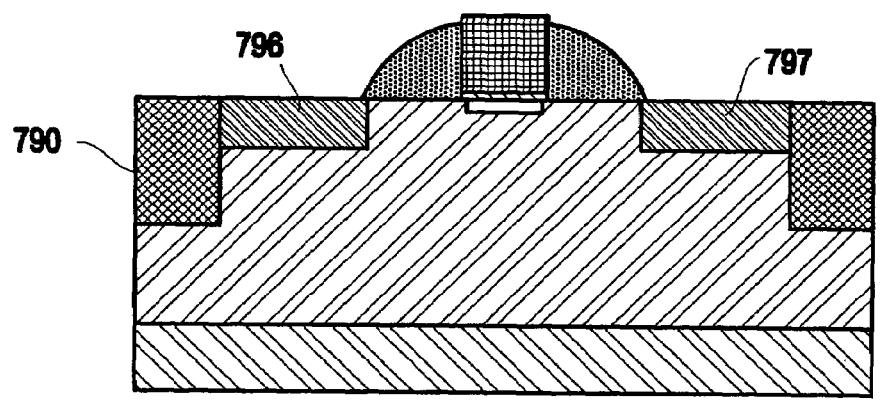
Figure 7C:
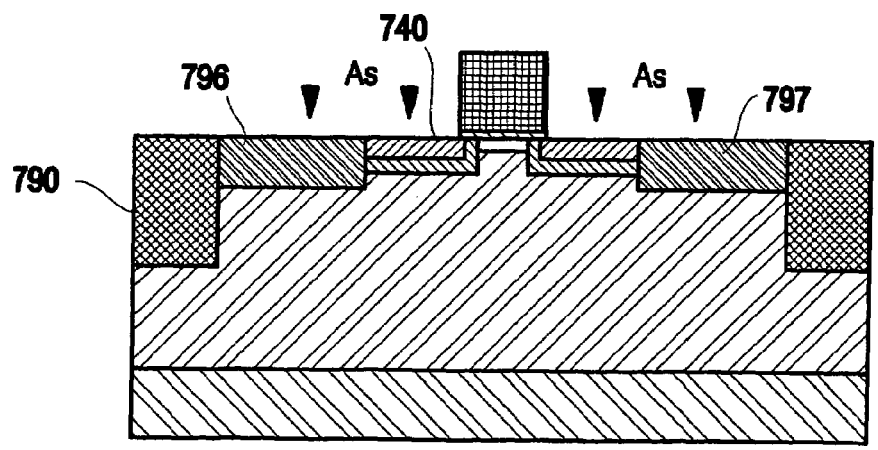
Figure 7D:
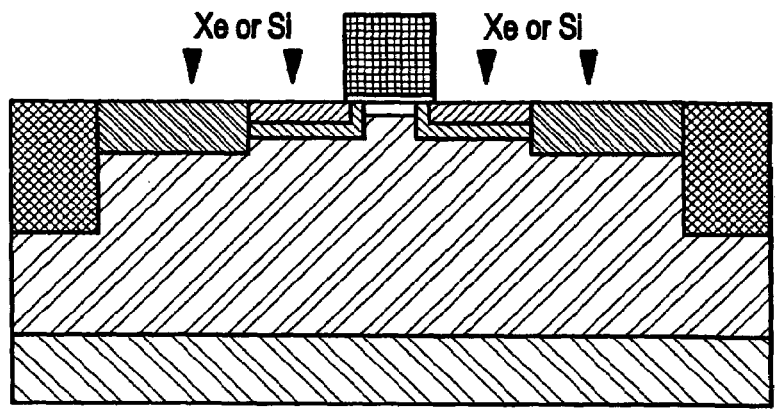
Figure 7E:
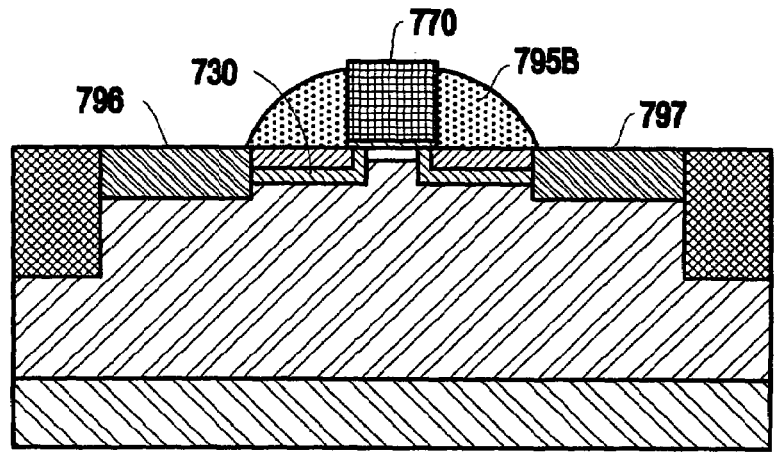

First, in FIG. 7A and as shown in FIG. 7E, in step 710, a disposable spacer 795A is formed adjacent a gate 770.

That is, the structure of FIG. 7A includes a substrate 710 (e.g., preferably formed of silicon, silicon-on-insulator, or the like), a relaxed $Si_{1-x}/Ge_x$ layer 720 formed over (e.g., on top of) the substrate 710. The Si/Ge layer 720 preferably is a graded layer which has a crystal lattice which is more and more relaxed in a direction away from a top surface of the substrate 710.

A strained silicon channel 750 is formed underneath the gate 770.

The gate 770 (e.g., formed of polysilicon, metal or the like) is formed above a stained silicon channel 750. A gate oxide 760 is formed between the gate 770 and the channel 750. A shallow trench isolation (STI) 790, formed of dielectric or the like, is formed between devices.

The disposable spacer 795A is for forming the source/drain, and will mask the area where the arsenic junction extension will be formed.

As illustrated in FIG. 7B (and step 720 of FIG. 7G), the source 796/drain 797 junction is formed.

In FIG. 7C (and step 730 of FIG. 7G), the disposable spacer 795A is removed, and the extension junction implant is formed (e.g., with Arsenic) for forming the extension regions 740.

As illustrated exemplary in FIG. 7D, after the removal of the disposable spacer 795A and the implant of arsenic dopants in the extension regions 740, the atom/ion species (e.g., Xe, Si, etc.) are implanted around the arsenic extension junction 740 region of the NMOS device in strained Si/Si$_{1-x}$Ge$_x$ substrates.

In FIG. 7D (and as shown in FIG. 7E, in step 740), the species (e.g., Xe, Ge, Si, Ar, Kr, Ne, He and N) implant 730 is formed.

Figure 7F:
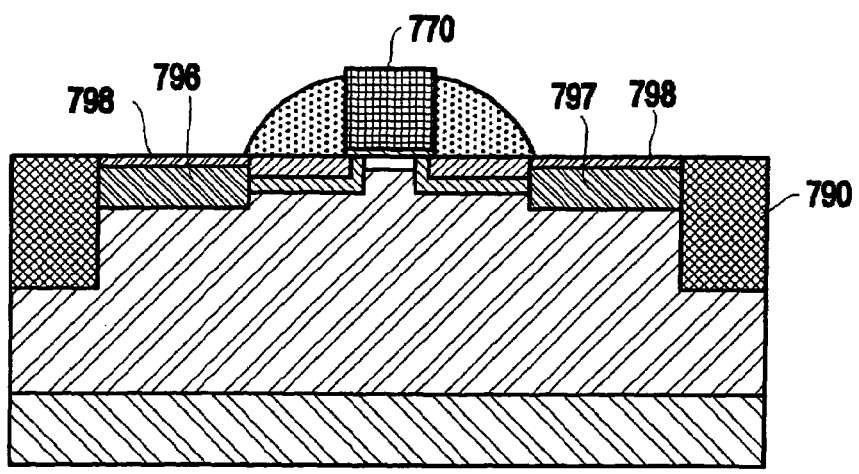
Figure 7G:
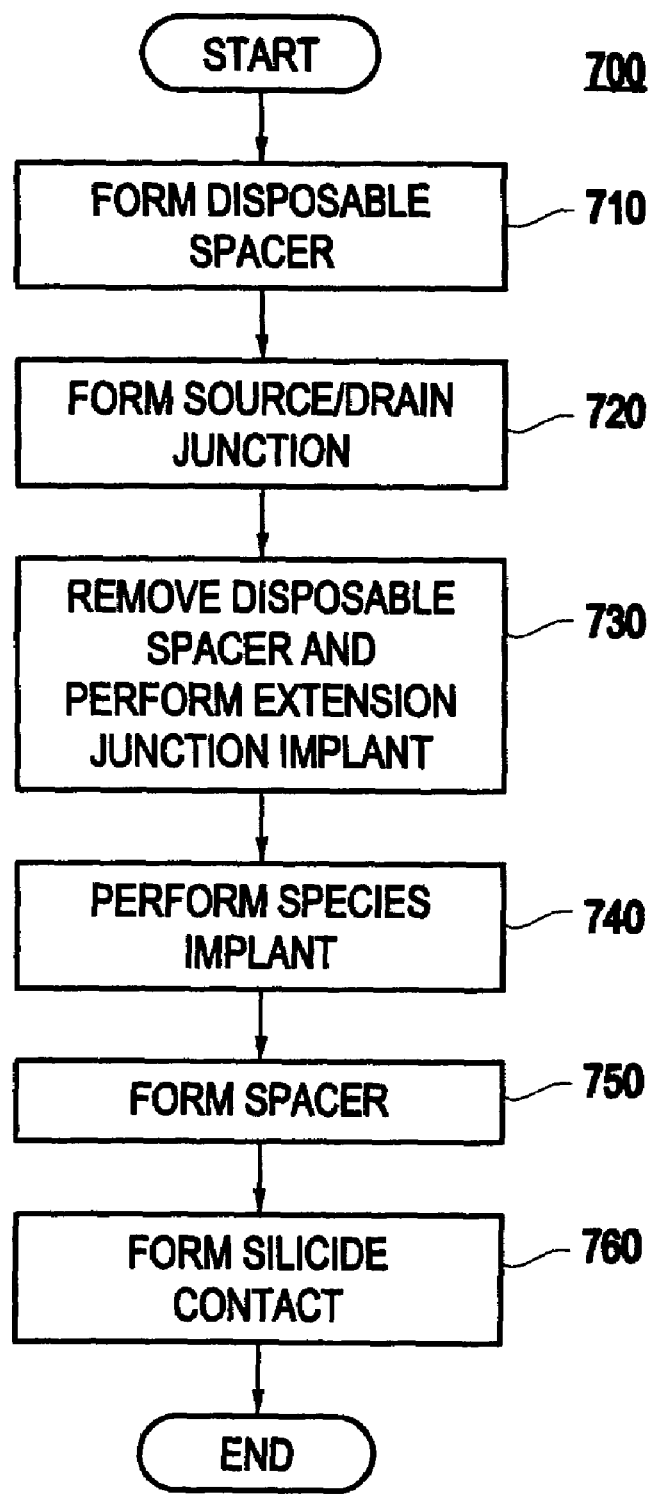
FIG. 7G illustrates a flowchart 700 of the exemplary technique of FIGS. 7A–7F.

Then, in FIG. 7E (and as shown in FIG. 7G, in step 750), a spacer 795B is formed, as well as a source/drain implantation is performed, thereby to form the source 796 and drain 797. Thereafter, a source/drain anneal is performed.

In FIG. 7F (and as shown in FIG. 7G, in step 760), contacts 798 are formed over the source 796 and drain 797, thereby to complete the device.

It is noted that processing similar to the third exemplary technique (e.g., as shown in FIGS. 6A–6D) could be employed in which the atom/ion species implant could be performed relatively deep, so as to surround/enclose (e.g., surround at least a portion of) the extension and the source/drain region.

Thus, with the techniques of the invention, ultra-shallow junctions can be formed in strained silicon (or silicon) which have not been achievable prior to the present invention.

While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of forming a semiconductor device, comprising:
    implanting, on a substrate, a dopant to form a dopant extension region;
    implanting at least one species, on a substrate to form a region surrounding at least a portion of said dopant extension region; and
    annealing said substrate, said at least one species retarding a diffusion of said dopant during said annealing of said substrate,
    wherein said substrate comprises a graded SiGe layer having a crystal lattice which is more relaxed in a direction extending away from a top surface of the substrate and a concentration of Ge that increases in a direction extending away from the top surface of the substrate.

2. The method of claim 1, wherein a dosage of said at least one species exceeds a preamorphization threshold of said substrate.

3. The method of claim 1, wherein a dosage of said at least one species comprises at least about 3 times the preamorphization threshold of said substrate.

4. The method of claim 1, wherein a dosage of said at least one species comprises at least about 5 times the preamorphization threshold of said substrate.

5. The method of claim 1, wherein a dosage of said at least one species comprises at least about 7 times the preamorphization threshold of said substrate.

6. The method of claim 1, wherein at least one species damages a junction formed by the dopant.

7. The method of claim 6, wherein said junction comprises a depth of no more than about 30 nm.

8. The method of claim 6, wherein said junction comprises a slope which is at least about 5 nm per decade of change in concentration of said dopant.

9. The method of claim 1, wherein said substrate comprises a material selected from the group consisting of silicon, SiGe, strained Si and strained SiGe.

10. The method of claim 1, wherein said at least one species comprises a material selected from the group consisting of Xe, Ge, Si, Ar, Kr, Ne, He and N.

11. The method of claim 1, wherein said dopant comprises a material selected from the group consisting of As, P and Sb.

12. The method of claim 1, wherein said dopant is implanted at a dine which is one of prior to said implanting said species, and after said implanting said species.

13. The method of claim 1, further comprising:
    forming a source region and a drain region in said substrate; and
    forming a metal suicide contact over said source region and said drain region.

14. The method of claim 13, wherein said source region and said drain region are formed at a time which is prior to said implanting of said dopant.

15. The method of claim 13, wherein said source region and said drain region are formed at a time which is after said implanting of said dopant.

16. The method of claim 14, wherein said dopant is implanted at a time which is one of prior to said implanting said species, and after said implanting said species.

17. The method of claim 15, wherein said dopant is implanted at a time which is one of prior to said implanting said species, and after said implanting said species.

18. The method of claim 1, wherein said species is implanted at least about 10 to about 20 nm deeper than said dopant.

19. The method of claim 1, wherein said species has an implantation energy sufficient to create said region surrounding at least a portion of said dopant extension region in said substrate.

20. The method of claim 1, wherein said species has a first implantation energy sufficient to create said region surrounding at least a portion of said dopant extension region in said substrate, and a second implantation energy sufficient to create a region surrounding at least a portion of a source/drain region in said substrate.

21. The method of claim 1, wherein said species has an implantation energy sufficient to create a region surrounding at least a portion of said extension region and at least a portion of a source/drain region in said substrate.

22. The method of claim 1, wherein said annealing said substrate is performed after said implanting said dopant and said implanting said species.

23. A method of forming a shallow and abrupt junction in a semiconductor substrate, comprising:
    implanting a dopant on a substrate to form a dopant extension region;
    implanting at least one species in a vicinity of said dopant in a dosage which far exceeds a preamorphization threshold of said substrate to form a region surrounding at least a portion of said dopant extension region; and
    annealing said substrate, said at least one species retarding a diffusion of said dopant during said annealing of said substrate, such that a shallow and abrupt junction is formed,
    wherein said substrate comprises a graded SiGe layer having a crystal lattice which is more relaxed in a direction extending away from a top surface of the substrate and a concentration of Ge that increases in a direction extending away from the top surface of the substrate.

24. A semiconductor device, comprising:
a semiconductor substrate;
a dopant formed in said substrate, to define a junction; and
a species formed in a vicinity of said junction and in a concentration which far exceeds a preamorphization threshold of said substrate to form a region surrounding at least a portion of said junction,
wherein said substrate comprises a graded SiGe layer having a crystal lattice which is more relaxed in a direction extending away from a top surface of the substrate and a concentration of Ge that increases in a direction extending away from the top surface of the substrate.

25. The device of claim 24, further comprising:
a source region and a drain region formed adjacent said dopant and said species;
a channel formed between said source region and said drain region;
a gate formed over said channel; and
a contact formed over said source region and said drain region.

26. The device of claim 25, wherein a region of said species surrounds at least a portion of said junction, and at least a portion of said source region and said drain region.

27. The device of claim 24, wherein said junction comprises a depth of no more than about 30 nm, and a slope which is at least about 5 cm per decade of change in concentration of dopant.

28. The device of claim 24, wherein said substrate comprises one of silicon, SiGe, and strained Si.

29. The device of claim 28, wherein said SiGe comprises one of relaxed SiGe and strained SiGe.

30. The device of claim 29, wherein said strained SiGe comprises SiGe under one of a compressive strain and a tensile strain.

31. The method of claim 1, wherein said substrate comprises a material selected from the group consisting of SiGe, strained Si, strained SiGe and relaxed SiGe.

32. The method of claim 1, wherein said at least one species comprises a material selected from the group consisting of Xe, Kr, Ne, He and N.

33. The device of claim 24, wherein said at least one species comprises a material selected from the group consisting of Xe, Kr He and N.

34. The method of claim 1, wherein said at least one species comprises a material that is different from said dopant.

35. The method of claim 1, further comprising:
forming a stained silicon channel adjacent said dopant extension region.

36. The method according to claim 1, wherein said region surrounding at least a portion of said dopant extension region is formed under said dopant extension region and comprises a lip portion which extends along at least one side of said dopant extension region.

37. The method according to claim 1, further comprising:
forming a disposable spacer to mask a region where said dopant is implanted.

38. The method of claim 1, wherein said at least one species comprises a material selected from the group consisting of Xe, Ar, and Kr.

39. The method of claim 1, wherein said dopant comprises As.

40. The method of claim 1, wherein said at least one species comprises a material selected from the group consisting of Xe, Ar, and Kr, and
wherein said dopant comprises As.

41. The method of claim 1, wherein said at least one species comprises Xe, and
wherein said dopant comprises As.

* * * * *